US006884563B2

(12) United States Patent
Leon et al.

(10) Patent No.: US 6,884,563 B2
(45) **Date of Patent: *Apr. 26, 2005**

(54) THERMAL IMAGING MATERIAL CONTAINING COMBUSTIBLE NITRO-RESIN PARTICLES

(75) Inventors: Jeffrey W. Leon, Rochester, NY (US); Robert E. McCovick, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 51 days.

This patent is subject to a terminal disclaimer.

(21) Appl. No.: 10/441,547

(22) Filed: May 20, 2003

(65) Prior Publication Data

US 2004/0234887 A1 Nov. 25, 2004

(51) Int. Cl.[7] ........ G03F 7/004

(52) U.S. Cl. ........ 430/270.1; 430/302; 430/905; 430/944; 430/945; 430/954

(58) Field of Search ........ 430/270.1, 302, 430/954, 905, 944, 945

(56) References Cited

U.S. PATENT DOCUMENTS

| | | | | | |
|---|---|---|---|---|---|
| 3,795,025 | A | | 3/1974 | Sadamitsu | |
| 3,953,386 | A | | 4/1976 | Murphy et al. | |
| 4,970,247 | A | | 11/1990 | Hoppe et al. | |
| 5,324,617 | A | | 6/1994 | Majima et al. | |
| 5,816,162 | A | | 10/1998 | Vermeersch | |
| 5,932,394 | A | | 8/1999 | Van Hunsel et al. | |
| 5,948,591 | A | | 9/1999 | Vermeersch et al. | |
| 5,952,136 | A | | 9/1999 | Daems et al. | |
| 5,981,144 | A | | 11/1999 | Damme et al. | |
| 6,001,536 | A | | 12/1999 | Vermeersch et al. | |
| 6,022,667 | A | | 2/2000 | Vermeersch et al. | |
| 6,030,750 | A | | 2/2000 | Vermeersch et al. | |
| 6,040,115 | A | | 3/2000 | Bailey et al. | |
| 6,071,369 | A | | 6/2000 | Vermeersch et al. | |
| 6,096,481 | A | | 8/2000 | Vermeersch et al. | |
| 6,106,996 | A | | 8/2000 | VanDamme et al. | |
| 6,110,644 | A | | 8/2000 | Vermeersch et al. | |
| 6,110,645 | A | | 8/2000 | DeBoer et al. | |
| 6,124,079 | A | | 9/2000 | Vermeersch et al. | |
| 6,190,828 | B1 | | 2/2001 | Verschueren et al. | |
| 6,248,805 | B1 | * | 6/2001 | Nguyen et al. | 523/160 |
| 6,391,516 | B1 | | 5/2002 | Vermeersch et al. | |
| 6,427,595 | B1 | | 8/2002 | Van Damme et al. | |
| 6,653,042 | B1 | * | 11/2003 | Fukino et al. | 430/270.1 |

FOREIGN PATENT DOCUMENTS

| | | | |
|---|---|---|---|
| EP | 0 514 145 | A1 | 11/1992 |
| EP | 0 666 184 | A1 | 8/1995 |
| EP | 0 839 090 | B2 | 6/1998 |
| EP | 0 849 091 | B1 | 3/2001 |
| EP | 1 080 884 | A1 | 3/2001 |
| EP | 1 118 472 | A1 | 7/2001 |
| EP | 1 179 422 | A1 | 2/2002 |
| EP | 0 770 49 | B1 | 3/2002 |
| EP | 0 839 647 | B1 | 3/2002 |
| EP | 0 770 497 | B1 | 4/2002 |
| EP | 0 770 495 | B1 | 6/2002 |
| EP | 0 931 647 | B1 | 4/2003 |

* cited by examiner

*Primary Examiner*—Amanda Walke
(74) *Attorney, Agent, or Firm*—J. Lanny Tucker

(57) ABSTRACT

A heat-sensitive composition can be used to make a heat-sensitive imaging material. The composition includes a water-soluble or water-dispersible binder and dispersed therein, a photothermal conversion material, and hybrid particles of a combustible nitro-resin and an addition polymer derived from one or more ethylenically unsaturated polymerizable monomers. The hybrid particles preferably have a core-shell structure with the combustible nitro-resin comprising the core and the addition polymer providing the shell. These imaging materials are particularly useful as "direct-write" thermally imageable elements useful to provide lithographic printing plates without ablation or the need for alkaline development.

22 Claims, No Drawings

THERMAL IMAGING MATERIAL CONTAINING COMBUSTIBLE NITRO-RESIN PARTICLES

CROSS REFERENCE TO RELATED APPLICATION

Reference is made to copending and commonly assigned U.S. Ser. No. 10/441,383 filed by Leon on even date herewith, and entitled "Core-Shell Nitro-Resin Particles and Method of Preparation".

FIELD OF THE INVENTION

This invention relates in general to thermal imaging materials that are useful to make lithographic printing plates that require no wet processing after imaging. This invention also relates to an imaging formulation that can be used to form the imaging materials and to imaging and printing methods.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and ink is then applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

"Direct-write" imaging generally uses infrared radiation from a laser source. More particularly, a computer-controlled infrared laser imagewise exposes small regions of a thermally sensitive composition to produce an image area, pixel by pixel.

Such thermally sensitive printing plates are becoming more common. Examples of such plates are described in U.S. Pat. No. 5,372,915 (Haley et al.). They include an imaging layer comprising a mixture of dissolvable polymers and an infrared radiation absorbing compound. While these plates can be imaged using lasers and digital information, they require wet processing using alkaline developer solutions.

It has further been recognized that such direct writing techniques may be utilized in the formation of "processless" printing plates. As used herein, the term "processless" refers to imaging materials that do not require one or more conventional processing steps (for example development) prior to mounting on a printing press. In some publications, such imaging materials are known as "printing plate precursors".

One method for forming processless printing plates is through ablation of a thermally sensitive layer. Thus, it has been recognized that a lithographic printing plate could be created by ablating an IR absorbing layer. For example, Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). When such plates were exposed to focused, near IR radiation using a laser, the absorbing layer converts the infrared energy to heat thus partially loosening, vaporizing, or ablating the absorber layer and the overlying silicone rubber. Similar printing plates are described in *Research Disclosure* 19201, 1980 as having vacuum-evaporated metal layers to absorb laser radiation in order to facilitate the removal of the silicone rubber overcoat layer.

While the noted abatable printing plates used for digital, processless printing have a number of advantages over the more conventional photosensitive printing plates, there are a number of disadvantages with their use. The process of ablation creates debris and vaporized materials that must consequently be collected. Moreover, the laser power required for ablation can be considerably high, and the components of such printing plates may be expensive, difficult to coat, or unacceptable for resulting printing quality.

Thermal or laser mass transfer is another method of preparing processless lithographic printing plates, as described for example, in U.S. Pat. No. 5,460,389 (Peterson) wherein a hydrophobic image is transferred from a donor sheet to a microporous hydrophilic crosslinked silicated surface of a received sheet.

Thermally switchable polymers have been described for use as imaging materials in processless printing plates. By "switchable" is meant that the polymer is rendered from hydrophobic to relatively more hydrophilic or, conversely from hydrophilic to relatively more hydrophobic, upon exposure to heat. EP 0 652,483 (Ellis et al.) describes imaging materials of this type.

U.S. Pat. No. 6,190,830 (Leon et al.), U.S. Pat. No. 6,190,831 (Leon et al.), and U.S. Pat. No. 5,985,514 (Zheng et al.) are directed to processless direct write imaging members that include an imaging layer containing heat sensitive ionomers. The polymer coatings are sensitized to infrared radiation by the incorporation of an infrared absorbing material such as an organic dye or a fine dispersion of carbon black. Upon exposure to a high intensity infrared laser, light absorbed by the organic dye or carbon black is converted to heat, thereby promoting a physical change in the ionomer (usually a change in hydrophilicity or hydrophobicity). The imaged materials can be used, for example, on conventional printing presses to provide negative images. Such printing plates have utility in the evolving "direct write" printing market.

Heat-sensitive compositions and imaging members that include heat-decomposable microcapsules are described in U.S. Pat. No. 5,569,573 (Takahashi et al.). U.S. Pat. No. 4,970,247 (Hoppe et al.) describes lacquers that are formulated from particles containing cellulose esters and polymerized monomers that are dispersed in a continuous phase.

A printing material containing an imaging layer that contains nitrocellulose particles that are encapsulated with polystyrene dispersed in a binder is described in U.S. Pat. No. 5,324,617 (Majima et al.). Printing plates containing thermoplastic particles are described, for example, in U.S. Pat. No. 6,106,996 (Van Damme et al.) and EP 0 514 145A1 (Matthews et al.). These particles coalesce upon application of thermal energy.

The graphic arts industry is constantly seeking alternative means for providing direct-write lithographic imaging members that can be readily imaged in "direct-write" printing using digital information without ablation and conventional wet post-imaging processing steps.

SUMMARY OF THE INVENTION

The present invention provides an imaging material comprising a support having thereon an imaging layer comprising a water-soluble or water-dispersible binder and dispersed therein:

a photothermal conversion material, and hybrid particles comprised of a combustible nitro-resin and an addition polymer derived from one or more ethylenically unsaturated polymerizable monomers.

This invention also provides a heat-sensitive imaging composition comprising a water-soluble or water-dispersible binder and dispersed therein, a photothermal conversion material, and hybrid particles of a combustible nitro-resin and an addition polymer derived from one or more ethylenically unsaturated polymerizable monomers.

In preferred embodiments, the polymer noted above is represented by the following Structure I:

$$CH_2{=}C(R){-}X \quad (I)$$

wherein R is hydrogen or methyl, and X is any monovalent moiety except a phenyl group.

In yet other preferred embodiments, the hybrid particles are core-shell particles comprising a nitro-resin core and a shell at least partially disposed around the core comprised of the noted addition polymer, wherein the weight ratio of the nitro-resin core to the addition polymeric shell is from about 20:1 to about 0.2:1.

Moreover, in more preferred embodiments, this invention provides a lithographic imaging material comprising a polyester or aluminum support having thereon a lithographic imaging layer comprising a water-soluble or water-dispersible binder and dispersed therein, a photothermal conversion material, and core-shell particles comprising a core of nitrocellulose and a shell completely covering the core, the shell comprising an addition polymer that is poly(acrylate), poly(methacrylate), poly(acrylamide), or poly(methacrylamide), wherein the weight ratio of the nitrocellulose core to the addition polymeric shell is from about 5:1 to about 0.5:1, and the core-shell particles comprise from about 25 to about 99 weight % (preferably from about 70 to about 99 weight %) of the imaging layer, based on total dry layer weight.

By "water-soluble" or "water-dispersible" is meant that the addition polymer can be removed from the imaging material using water or conventional fountain solutions.

Further, a method of imaging of this invention comprises:

A) providing the imaging material of the present invention, and

B) imagewise exposing the imaging material to thermal energy to provide exposed and unexposed areas in the imaging layer of the imaging material, whereby the exposed areas become more hydrophobic than the unexposed areas.

A method of printing of this invention comprises:

A) providing a lithographic imaging material of the present invention,

B) imagewise exposing the lithographic imaging material to thermal energy to provide exposed and unexposed areas in the imaging layer of the lithographic imaging material, whereby the exposed areas become more hydrophobic than the unexposed areas to provide a lithographic printing plate, and C) with or without processing, and in the presence of water or a fountain solution, contacting the imagewise exposed lithographic printing plate with a lithographic printing ink, and imagewise transferring the lithographic printing ink to a receiving material.

The present invention provides a number of advantages in the thermal imaging technologies, and particularly for providing "direct-write" thermal materials used to make lithographic printing plates. The imaging materials are less ablatable during thermal imaging and by modifying the composition of the polymer in the hybrid particles, the physical properties of the imaged areas can be readily modified as desired. When thermally imaged, the heat causes combustion of the nitrocellulose serves particles, leading to a tougher and more chemically resistant image. In addition, the introduction of highly polar surface functionalities in the polymer, particularly in the surface of the hybrid (for exampe, core-shell) particles, improves the wash-off of the non-imaged regions. Thus, the discrimination between imaged and non-imaged regions of resulting lithographic printing plates is improved.

DETAILED DESCRIPTION OF THE INVENTION

The imaging compositions and materials of the present invention are imageable by radiation of some type that provides or generates thermal energy to provide a printing surface that has oleophilic and non-oleophilic regions. In their simplest form, they are precursors to lithographic printing plates and include a suitable support having disposed thereon one or more layers that provide an imaging surface. In most instances, a hydrophilic imaging surface is rendered more hydrophobic, or a hydrophobic imaging surface is rendered more hydrophilic, upon imaging. At least one layer used for imaging comprises the hybrid nitro-resin particles described herein.

As used herein "lithographic imaging materials" refers to both the lithographic printing plate precursors (prior to imaging) as well as the resulting lithographic printing plates.

The nitro-resin in the hybrid particles useful in the present invention is "combustible" and not "coalescible". This means that greater than 25% (preferably greater than 90%) of the weight of the nitro-resin is lost (as measured by thermogravimetric analysis via an oxidative or autoxidative pathway) during heating. Thus, it is considered that the particles used in the practice of this invention are not "thermoplastic" materials because at least some of the particles are combusted during imaging. Completely thermoplastic materials are known in the art to be materials that undergo no chemical change when heated to a temperature where "flow" can occur. No completely thermoplastic particles are provided in the imaging materials of the present invention.

The imaging materials can be composed of a mixture of the hybrid particles described herein and one or more photothermal conversion materials in one or more heat-sensitive imaging layers. Imaging of such imaging materials can be carried out using lasers and digital information, and conventional alkaline developers can be avoided.

The imaging materials of this invention comprise a support and one or more layers thereon that preferably include a dried heat-sensitive composition as described herein. The support can be any self-supporting material including polymeric films, glass, ceramics, cellulosic materials (including papers), metals (such as aluminum, zinc, titanium, and alloys thereof), or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 μm. Another preferred embodiment uses aluminum sheets having a thickness of from about 100 to about 600 μm, which sheets can be electrolytically grained, anodized, or otherwise treated as known in the art. The support should resist dimensional change under conditions of use.

The support may also be a cylindrical support that includes printing cylinders on press as well as printing sleeves that are fitted over printing cylinders. The use of such supports to provide cylindrical imaging members is described in U.S. Pat. No. 5,713,287 (Gelbart). The heat-sensitive composition of this invention can be coated or sprayed directly onto the cylindrical surface that is an integral part of a printing press.

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) that are known for such purposes in the photographic industry, vinylphosphonic acid polymers, sol gel materials such as those prepared from alkoxysilanes (including glycidoxypropyltriethoxysilane and aminopropyltriethoxysilane), epoxy functional polymers, and various ceramics.

The backside of the support may be coated with antistatic agents and/or slipping layers or matte layers to improve handling and "feel" of the imaging material.

The imaging materials, however, preferably have only one layer on the support, that is a heat-sensitive surface layer that is required for imaging. This layer is prepared from the heat-sensitive composition of this invention that includes one or more photothermal conversion materials (described below) and one or more hybrid particles as described herein, as the only essential components required for imaging. The exposed (imaged) areas of the layer are rendered more hydrophobic in nature while the non-exposed areas remain hydrophilic in nature.

Hybrid Particles:

The hybrid particles useful in the present invention include one or more nitro-resins and one or more addition polymers prepared from one or more ethylenically unsaturated polymerizable monomers. The nitro-resin(s) and addition polymer(s) can be homogeneously mixed within the particles or the particles can have regions of one type of polymer or the other. In preferred embodiments, the particles comprise a core of a nitro-resin that is at least partially (preferably entirely) covered with a shell of the addition polymer. These preferred core-shell particles are described in more detail below. Alternatively, the particles can be composed of a "hybrid core" composed of both a nitro-resin and one or more addition polymers, which hybrid core is at least partially (preferably entirely) covered with a shell of the same or different addition polymers.

The "nitro-resin" is a self-combustible material and includes nitrocellulose and other nitrate esters of cellulosic materials (or carbohydrates) known in the art. Nitrocellulose is the preferred nitro-resin used in the present invention. A mixture of nitro-resins can also be used. The nitro-resins can be obtained from a number of commercial sources including Synthesia and Hercules Companies, or they can be prepared using starting materials and procedures known to a skilled polymer chemist.

The addition polymer(s) in the hybrid particles are derived from one or more water-insoluble ethylenically unsaturated polymerizable monomers (except styrene and styrene derivatives because their free radical polymerization is largely quenched by the presence of nitrocellulose).

More particularly, these one or more monomers are represented by the following Structure I:

$$CH_2{=}C(R){-}X \qquad (I)$$

wherein R is hydrogen or methyl, and preferably R is hydrogen.

X is any monovalent moiety except a phenyl group. For example, X can be an alkyl ester, alkyl amide, aryl ester, or aryl amide group wherein the alkyl group is substituted or unsubstituted and comprises 1 to 16 carbon atoms (preferably from 1 to 6 carbon atoms), and the aryl group is substituted or unsubstituted and comprises 6 to 10 carbon atoms in the aromatic ring. Preferably, X is an alkyl ester or alkyl amide wherein the alkyl group is substituted or unsubstituted and has from 1 to 6 carbon atoms. Preferably, at least 90% by weight of the water-insoluble monomers used in this invention will have X moieties comprise less than 7 carbons.

Representative substituents on the noted alkyl or aryl groups include, but are not limited to, methyl, ethyl, isopropyl, n-propyl, n-butyl, iso-butyl, t-butyl, neo-pentyl, phenyl, benzyl, cyclohexyl, iso-bornyl, and 2-ethylhexyl.

Representative monomers represented by Structure I include, but are not limited to, methyl acrylate, methyl methacrylate, ethyl acrylate, ethyl methacrylate, t-butyl methacrylate, iso-propyl acrylate, ethyl methacrylate, benzyl acrylate, benzyl methacrylate, propyl acrylate, propyl methacrylate, iso-propyl acrylate, iso-propyl methacrylate, n-butyl acrylate, n-butyl methacrylate, hexyl acrylate, hexyl methaerylate, octadecyl methacrylate, octadecyl acrylate, lauryl methacrylate, lauryl acrylate, hydroxylauryl methacrylate, hydroxylauryl acrylate, phenethylacrylate, phenethyl methacrylate, 6-phenylhexyl acrylate, 6-phenylhexyl methacrylate, phenyllauryl acrylate, phenyllaurylmethacrylate, 3-nitrophenyl-6-hexyl methacrylate, cyclohexyl acrylate, 3-methacryloxypropyl-dimethylmethoxysilane, 3-methacryloxypropyl-methyldimethoxysilane, 3-methacryloxypropyl-pentamethyldisiloxane, 3-methacryloxypropyltris-(trimethylsiloxy)silane, 3-acryloxypropyl-dimethylmethoxysilane, acryloxypropylmethyldimethoxysilane, trifluoromethyl acrylate, trifluoromethyl methacrylate, tetrafluoropropyl acrylate, tetrafluoropropyl methacrylate, heptafluorobutyl methacrylate, iso-butyl acrylate, iso-butyl methacrylate, 2-ethylhexyl acrylate, 2-ethylhexyl methacrylate, iso-octyl acrylate, iso-octyl methacrylate, N-t-butyl acrylamide, N-isopropyl acrylamide, N-cyclohexyl acrylamide, N-phenyl acrylamide, N,N-dihexyl acrylamide, N,N-dioctyl acrylamide, vinyl propionate, vinyl acetate, vinyl butyrate, methyl methacrylate, methyl acrylate, glycidyl acrylate, glycidyl methacrylate, vinyl 4-phenylpyrrolidone, allyl methacrylate, allyl acrylate, butenyl acrylate, undecenyl acrylate, undecenyl methacrylate, vinyl acrylate, and vinyl methacrylate. Preferred water-insoluble monomers are acrylate esters or with 4–9 carbons or acrylamides with 5–13 carbons.

Mixtures of two or more monomers can be used if desired.

Particularly useful monomers represented by Structure I are t-butyl acrylate, phenyl acrylate, and sodium sulfopropyl acrylate.

In addition (and indeed preferably), the addition polymer can be comprised of a "copolymer" that includes recurring units derived from two or more different ethylenically unsaturated polymerizable monomers, as long as at least one of those monomers is represented by Structure I. Such copolymers are included in the following Structure II (that also include polymers derived solely from monomers of Structure I):

$$-(A)_x-(B)_y- \quad (II)$$

wherein "A" represents recurring units derived from said or more ethylenically unsaturated polymerizable monomers defined by Structure I, "B" represents recurring units derived from one or more "additional" ethylenically unsaturated polymerizable monomers, "x" represents from about 80 to 100 mol % (preferably from about 90 to 100 mol %), and "y" represents from 0 to about 20 mol % (preferably from 0 to about 10 mol %), based on total moles of recurring units.

The "additional" ethylenically unsaturated polymerizable monomers can be any ethylenically unsaturated polymerizable monomer other than those represented by Structure I. Such monomers include, but are not limited to, water-soluble or crosslinking ethylenically unsaturated polymerizable monomers.

Water-soluble monomers include but are not limited to, negatively or positively charged ethylenically unsaturated polymerizable monomers as well as hydroxy-containing ethylenically unsaturated polymerizable monomers. Such negatively or positively charged ethylenically unsaturated polymerizable monomers can comprise one or more carboxy, phospho, sulfonato, sulfo, quaternary ammonium, sulfonium, phosphonium, or polyethylene oxide groups in the molecule. Particularly, useful water-soluble monomers are those containing sulfonato or quaternary ammonium groups. Water-soluble monomers may include, but are not necessarily limited to, vinyl 4-methylimidazole, acrylamide, methacrylamide, N,N-dimethyl acrylamide, N-methyl acrylamide, N-methyl methacrylamide, N-methyl acrylamide, N-methyl methacrylamide, and N,N-dimethyl acrylamide acrylic acid, methacrylic acid, chloromethacrylic acid, maleic acid, diallylamine, vinyl sulfonamide, sodium acrylate, sodium methacrylate, ammonium acrylate, ammonium methacrylate, acrylamidopropanetriethylammonium chloride, methacrylamidopropane-triethylammonium chloride, vinyl-pyridine hydrochloride, sodium vinyl phosphonate, sodium 1-methylvinylphosphonate, sodium vinyl sulfonate, sodium 1-methylvinyl-sulfonate, sodium styrenesulfonate, sodium acrylamidopropanesulfonate, sodium methacrylamidopropanesulfonate, sodium vinyl morpholine sulfonate, poly(ethylene glycol acrylate), poly (ethylene glycol methacrylate), hydroxyethyl acrylate, and hydroxyethyl methacrylate. Preferred water-soluble monomers include acrylic acid and its salts, acrylamide, and acrylate esters containing ionic groups.

Useful crosslinking monomers include compounds containing two or more ethylenically unsaturated polymerizable groups. Useful crosslinking monomers include esters of saturated glycols or diols with unsaturated monocarboxylic acids, such as, ethylene glycol diacrylate, ethylene glycol dimethacrylate, triethylene glycol dimethacrylate, 1,4-butanediol dimethacrylate, 1,3-butanediol dimethacrylate, pentaerythritol tetraacrylate, trimethylol propane trimethacrylate, hexanediacrylate, cyclohexanedimethanoldivinyl ester, trimethylolpropane diacrylate, trimethylolpropane dimethacrylate, methylenebisacrylamide, polyethylene glycol diacrylate, and polyethylene glycol dimethacrylate. Preferred monomers are compounds containing more than one acrylamide or more than one acrylate moiety (that is, polyacrylates, polyacrylamides, polymethacrylates, and polymethacrylamides), such as methylenebisacrylamide, ethylene glycol diacrylate, or hexanediacrylate.

Still other additional ethylenically unsaturated monomers from which "B" in Structure II can be derived are iso-prene, acrylonitrile, vinyl ethers, vinyl halides, butadiene, vinyl ketones, N-alkyl and N-aryl maleimides.

The various ethylenically unsaturated polymerizable monomers from which "B" can be derived are generally available from a number of commercial sources such as Aldrich Chemicals or Polysciences, or they can be prepared using starting materials and procedures known to a skilled polymer chemist.

As noted above, the preferred hybrid particles are core-shell particles in which the core is composed of a "nitro-resin" as described above. Nitrocellulose is the preferred nitro-resin used in the core. A mixture of nitro-resins can also be used as the "core" of the particles of the present invention.

Surrounding at least 50% (surface area), and preferably 80% (surface area), and most preferably 100% (surface area) of the core, is a polymeric shell that is composed of one or more addition polymers derived from one or more water-insoluble ethylenically unsaturated polymerizable monomers described above.

The preferred polymers used to form the polymeric shell comprise from about 80 to about 100 mol % of recurring units derived from one or more water-insoluble acrylate ester or water-insoluble N-substituted acrylamide, from about 2 to about 10 mol % of recurring units derived from a water-soluble acrylate or acrylamide, and from 0 to about 10 mol % of recurring units derived from an acrylate or acrylamide crosslinking monomer.

The non-nitro-resin component (that is the addition polymer) in the combustible hybrid particles useful in the present invention preferably has a glass transition temperature of from about 25 to about 150° C., and most preferably of from about 40 to about 120° C. Glass transition temperature is a well known polymer parameter that can be measured using known procedures and equipment as described for example, in Turi, *Thermal Characterization of Polymeric Materials,* $2^{nd}$ Ed., Academic Press, 1997.

In addition, the hybrid particles are generally spherical in shape and have an average size (for example, diameter) of from about 0.03 to about 2.0 $\mu$m (preferably from about 0.03 to about 0.50 $\mu$m). The particle size can be measured using known equipment and procedures (such as the Mie scattering or photon correlation spectroscopy methods or by optical or electron microscopy). The particles may not be perfectly spherical and the size would then refer to the largest dimension.

In general, the particles have a distribution of nitro-resin and addition polymer that are defined by a weight ratio of the nitro-resin to the addition polymers of from about 0.2:1 to about 20:1, and preferably from about 0.5:1 to about 5:1. Where the hybrid particles are core-shell particles, these weight ratios would refer to the core nitro-resin to the shell polymers.

The hybrid particles described herein are generally present in the heat-sensitive imaging layers of the imaging materials of this invention in an amount of at least 25 weight % (based on dry layer weight), and preferably at from about 70 to about 99 weight %. The upper limit can vary depending upon a number of factors including the amount of combustible nitro-resin the particles, the energy of the imaging apparatus, the thickness of the imaging layer, the type and molecular weight of the binder polymer that may be present, and the characteristics of the photothermal conversion material. In general, the upper limit is 99 weight %. One skilled in the art would be able to determine the appropriate amount of hybrid particles in the heat-sensitive compositions of this invention in order to provide the desired dry layer amount.

Hybrid particles useful in the present invention that are not core-shell particles (or that have a hybrid core and a homogeneous addition polymeric shell) can be prepared, in general, by the methods described in U.S. Pat. No. 3,953,386 (Murphy et al.) and U.S. Pat. No. 4,970,242 (Hoppe et al.). Both methods involve creating an aqueous emulsion of nitrocellulose dissolved in a mixture of ethylenically unsaturated polymerizable monomers and subsequently inducing polymerization. U.S. Pat. No. 4,970,242 further describes the additional step of creating a shell around a "hybrid core" by emulsion polymerization techniques.

The combustible core-shell particles useful in the present invention can be prepared in a number of ways, but a preferred method includes preparing an aqueous surfactant-stabilized dispersion of nitro-resin particles. This can be done, for example, by solvent evaporation techniques. This involves first forming a solution of nitrocellulose in a water-immiscible solvent in which it is soluble, and then suspending the nitrocellulose-solvent solution in water containing a suitable surfactant. The resulting suspension is subjected to high shear mixing to reduce the size of the polymer-solvent droplets. The shearing action is optionally stopped and the resulting polymer-solvent droplets may optionally coalesce to the extent allowed by the dispersing agent to form coalesced polymer-solvent droplets. The solvent is removed from the drops to form solidified polymer particles that are then optionally isolated from the suspension by filtration, sedimentation, centrifugation or other suitable means. Optionally, excess surfactant or other impurities can be removed by dialysis or ultrafiltration. Preferably, the particles are maintained as an aqueous dispersion. The nitrocellulose dispersion may have a solids concentration of from about 2 to about 50%. Preferably, the dispersion will have from about 5 to about 30% solids.

Any suitable solvent that will dissolve the nitrocellulose and that is also immiscible with water may be used, such as for example, chloromethane, dichloromethane, ethyl acetate, n-propyl acetate, iso-propyl acetate, vinyl chloride, methyl ethyl ketone (MEK), trichloromethane, carbon tetrachloride, ethylene chloride, trichloroethane, toluene, xylene, cyclohexanone, 2-nitropropane and others readily apparent to one skilled in the art. Preferred solvents includes n-propyl acetate, iso-propyl acetate, ethyl acetate and methylene chloride. Particularly preferred is n-propyl acetate or ethyl acetate.

By high shear mixing, it is meant that sufficient shearing energy is provided at approximately a rate of shear or velocity gradient of $10^5$ $min^{-1}$ or greater, more preferably $10^6$ $min^{-1}$ or greater. By rate of shear is meant a value obtained by dividing an absolute value of a difference of speeds of two planes by a distance between said two planes. A high-pressure homogenizer operated at 9653 kPa provides a rate of shear approximately equal to $6\times10^6$ $min^{-1}$. High-pressure homogenizers are preferred. Emulsification can be performed using methods and devices widely used in the art including, but not necessarily limited to, a high speed blade mixer, a chemical blender, a rotor stator device such as a Silverson mixer or high pressure homogenizer such as a Manton-Gaulin Homogenizer, a Sonolator, a probe sonicator, or a Microfluidizer®. A preferred emulsification device is the Model No. 110T Microfluidizer® produced by Microfluidics Manufacturing.

Suitable surfactants for this solvent evaporation process can be cationic, nonionic, zwitterionic, or anionic compounds and will typically have a hydrophile-lipophile balance that is greater than 8. The hydrophile-lipophile balance (HLB) parameter is defined in Griffin, W. C. *J. Soc. Cosmetic Chemists* 1949, 1, 311 and in Griffin, W. C *J. Soc. Cosmetic Chemists* 1954, 5, 249. There exist a tremendous number of known surfactants. Good reference sources for surfactants are the *Surfactant Handbook* (GPO: Washington, D.C., 1971) and *McCutcheon's Emulsifiers and Detergents* (Manufacturing Confectioner Publishing Company: Glen Rock, 1992). Useful surfactants will generally have a solubility or dispersibility in water or in a mixture of water and one or more water-miscible solvents. Some examples include, but are not necessarily limited to sodium dodecylsulfate, sodium dodecylbenzenesulfonate, sulfosuccinate esters, such as those sold under the AEROSOL® trade name, flourosurfactants, such as those sold under the ZONYL® and FLUORAD® trade names, sulfonated alkyl-substituted diphenyl ethers, such as those sold under the DOWFAX® trademark, ethoxylated alkylphenols, such as TRITON® X-100 and TRITON® X-705, ethoxylated alkylphenol sulfates, such as RHODAPEX® CO-436, phosphate ester surfactants such as GAFAC® RE-90, quaternary ammonium compounds such as hexadecyltrimethylammonium bromide and Uniquat® CB-50 (available from Lonza Inc., Switzerland), polyoxyethylenated long-chain amines and their quaternized derivatives, ethoxylated silicones, alkanolamine condensates, polyethylene oxide-co-polypropylene oxide block copolymers, such as those sold under the PLURONIC® and TECTRONIC® trade names, hydrophobe-end capped oligoacrylamides, such as those described in U.S. Pat. No. 6,127,453 (Erdtmann et al.), N-alkylbetaines, N-alkyl amine oxides, and alkylnaphthalenesulfonates, such as Alkanol XC® (available from E.I. DuPont de Nemours & Co.).

Once the core nitro-resin particles are prepared, they are included in a polymerization reaction medium wherein the monomers of Structure I (or Structure II) are incorporated, and free radical polymerization of the monomers is then initiated to form a covering or shell at least partially (preferably entirely) around the nitro-resin particles.

In accordance with the above-described process, the monomer(s) are added to the dispersion of nitrocellulose core particles continuously. The duration of the addition time depends on the types of monomers and reaction temperatures employed. The addition time can be shorter for more reactive monomers and at higher reaction temperatures. For monomers of low reactivity at a lower reaction temperature, a shorter monomer addition time may flood the system with free monomers that can form secondary polymer particles that comprise essentially no nitrocellulose phase. With longer addition times, the polymerization is carried out under monomer starvation conditions and almost all the monomers are consumed by the nitrocellulose core particles. For the preferred acrylamide or acrylate ester monomers, addition times will preferably be from about 30 to about 180 minutes.

In most cases, the monomer(s) will be added with surfactant. The amount of surfactant used will preferably be 0.5–5% based on the weight of the monomers added. Useful surfactants may be nonionic, anionic, cationic, amphoteric, oligomeric, or polymeric compounds. Especially useful surfactants are reactive surfactants. Reactive surfactants may be of any of the above classes and will contain polymerizable ethylenic unsaturation in addition to their amphiphilic moieties. Especially useful reactive surfactants are TREM®

LF-40 (sold by Cognis) and the Maxemul® line of surfactants, sold by Uniquema.

In accordance with the process noted above, a preferred way to cause an addition polymerization initiator to form a free radical is by using heat. Depending on the types of initiators used, the reaction temperature can vary from about 30 to about 90° C. Preferably, the reaction temperature is at least 40° C. and most preferably, it is at least 50° C. To ensure that no free monomer is present, usually the reaction is continued for a longer time after the monomer addition. Initiator may need also to be added to scavenge remaining monomers during the final stage of the reaction to increase the reaction conversion.

Addition polymerization initiators useful in the above-described process include, for examples, an azo and diazo compounds, such as 2,2'-azobisisobutyronitrile, 2,2'-azobis (2,4-dimethyl valeronitrile), 2,2'-azobis(2,3-dimethyl butyronitrile), 2,2'-azobis(2-methyl butyronitrile), 2,2'-azobis(2,3,3-trimethyl butyronitrile), 2,2'-azobis(2-isopropyl butyronitrile), 1,1'-azobis(cyclohexane-1-carbonitrile), 2,2'-azobis(4-methoxyl-2,4-dimethyl valeronitrile), 2-(carbamoylazo)isobutyronitrile, 4,4'-azobis (4-cyanovaleric acid), 4,4'-azobis(2-methylpropionamidine) dihydrochloride and dimethyl-2,2'azobis isobutyrate, or peroxide compounds, such as butyl peroxide, propyl peroxide, butyryl peroxide, benzoyl isobutyryl peroxide, and benzoyl peroxide, or water soluble initiators, for example, sodium persulfate, and potassium persulfate, or any redox initiators. The initiators may be used in an amount varying from about 0.2 to 3 or 4 weight % or higher by weight of the total monomers. Usually, a higher initiator concentration results in lower molecular weights of the final polymers. In general, since nitrocellulose can act as a trap for oxygen-centered radicals, azo-type initiators, especially water-soluble azo-type initiators (such as 4,4'-azobis(4-cyanovaleric acid), 4,4'-azobis(2-methylpropionamidine) dihydrochloride) and are preferred.

A chain transfer agent such as butyl mercaptan may also be used to control the properties of the polymer formed.

Photothermal Conversion Material:

It is desirable that the heat-sensitive imaging layer also includes one or more photothermal conversion materials to absorb appropriate radiation from an appropriate energy source (such as a laser), which radiation is converted into heat. Preferably, the radiation absorbed is in the infrared and near-infrared regions of the electromagnetic spectrum.

For example, the photothermal conversion materials can be bis(aminoaryl)polymethine IR dyes. This class of polymethine dyes are known and disclosed by Tuemmler et al., *J. Am. Chem. Soc.* 80, 3772 (1958), Lorenz et al., *Helv. Chem. Acta.* 28, 600, (1945), U.S. Pat. No. 2,813,802 (Ingle), U.S. Pat. No. 2,992,938 (McCarville), U.S. Pat. No. 3,099,630 (Wildi et al.), U.S. Pat. No. 3,275,442 (Kosenkranius), U.S. Pat. No. 3,436,353 (Dreyer et al.), U.S. Pat. No. 4,547,444 (Bell et al.), U.S. Pat. No. 5,135,842 (Kitchin et al.), and EP 0 652 483A1 (Ellis et al.).

Suitable carbon black photothermal conversion materials include surface-functionalized and/or polymer-grafted carbon black. The term "polymer grafted carbon black" denotes a chemically modified carbon black in which a synthetic polymer or copolymer is covalently bonded to the surface of the carbon particles. Such modified carbon materials may have improved dispersibility in specific solvents due to the steric stabilization imparted by the polymer grafts. Methods of introducing surface functionalities onto carbon particle surfaces include electrical discharge treatment (see JP Kokai 6-025572), treatment with ultraviolet radiation (see JP Kokai 5-339516), chemical oxidation (see FR 911,059, CA 537, 787, FR 1,195,792, GB 895,990, U.S. Pat. No. 2,439,442, and U.S. Pat. No. 3,216,843), and through control of the pyrolytic conditions under which the carbon black is manufactured ["Carbon Black," Marcel-Dekker, New York, 15 (1976)].

Additionally, numerous techniques have been reported for using these induced surface functionalities for grafting synthetic polymers onto carbon black. One method includes reacting surface functionalized carbon black with a polymer or copolymer containing specific chemical moieties known to react with the surface functionalized group (see JP Kokai 9-059331 and JP Kokai 8-337624). One such example is the modification of a carboxylic acid functionalized carbon with a polymer or copolymer containing aziridine, oxazoline, thioepoxide, N-hydroxyalkylamide, or epoxide moieties (see U.S. Pat. No. 4,880,857). Alternatively, a polymerization reaction may be carried out in the presence of a surface functionalized carbon black including chemical groups capable of initiating or terminating the polymerization. In JP Kokai 6-263830, such a procedure is reported in which a peroxide-functionalized carbon black is used to initiate the polymerization of vinylic monomers. Other such preparations are reported in JP Kokai 3-174422 and JP Kokai 56-129210.

Other useful photothermal conversion materials include various IR dyes, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. Particular dyes of interest are "broad band" dyes, that is those that absorb over a wide band of the spectrum.

Still other useful photothermal conversion materials include Prussian Blue, Paris Blue, Milori Blue, cyanine dyes, indoaniline dyes, oxonol dyes, porphyrin derivatives, anthraquinone dyes, merostyryl dyes, pyrylium compounds, or squarylium derivatives with the appropriate absorption spectrum and solubility. Dyes with a high extinction coefficient in the range of 750 nm to 1200 nm may also be suitable. Suitable absorbing dyes are also disclosed in numerous publications, for example, EP 0 823 327A1 (Nagasaki et al.), U.S. Pat. No. 4,973,572 (DeBoer), U.S. Pat. No. 5,244,771, U.S. Pat. No. 5,401,618 (Jandrue et al.), and U.S. Pat. No. 6,248,886 (Williams et al.). Examples of useful cyanine dyes include 2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride, 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride, 2-[2-[2-thiophenyl-3-[2-(1,3-dihydro-1,3,3-trimethyl-2H-indol-2-ylidene)-ethylidene]-1-cyclopenten-1-yl]-ethenyl]-1,3,3-trimethyl-3H-indolium tosylate, 2-[2-[2-chloro-3-[2-ethyl-(3H-benzthiazole-2-ylidene)ethylidene]-1-cyclohexen-1-yl]-ethenyl]-3-ethyl-benzthiazolium tosylate, and 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate. Other examples of useful absorbing dyes include ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors).

Additional examples of suitable IR dyes may include, but are not limited to, bis(dichlorobenzene-1,2-thiol)nickel(2:1) tetrabutyl ammonium chloride, tetrachlorophthalocyanine aluminum chloride, and the compounds provided in the following IR DYE TABLE.

IR DYE TABLE
| IR DYE | STRUCTURE |
|---|---|
| IR DYE 1 | 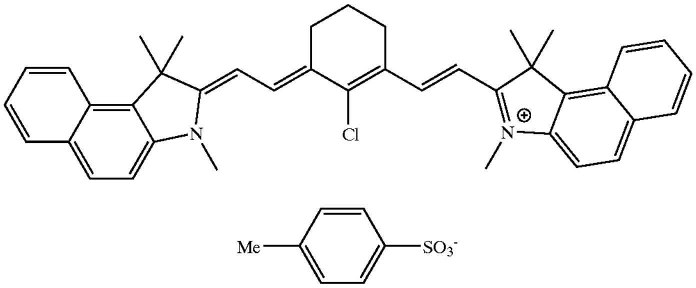 |
| IR DYE 2 | 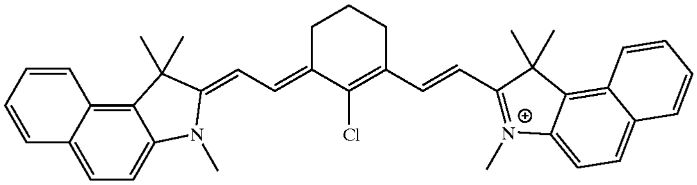 $C_3F_7CO_2^-$ |
| IR DYE 3 | 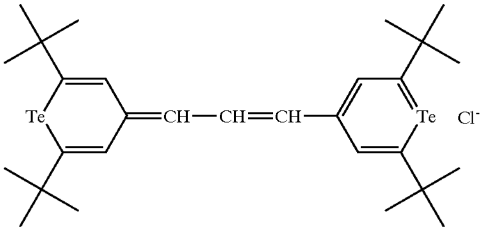 |
| IR DYE 4 | 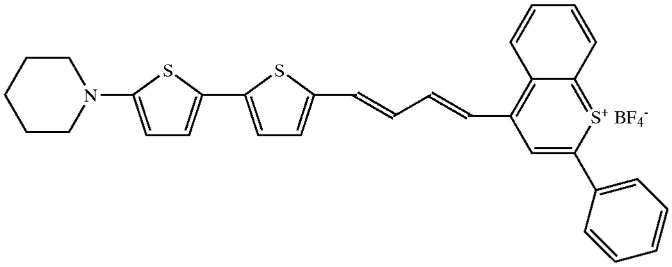 |
| IR DYE 5 | 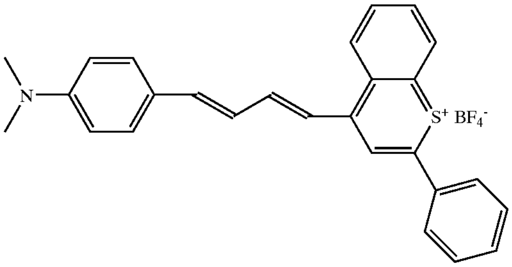 |

-continued
IR DYE TABLE
| IR DYE | STRUCTURE |
| --- | --- |
| IR DYE 6 | 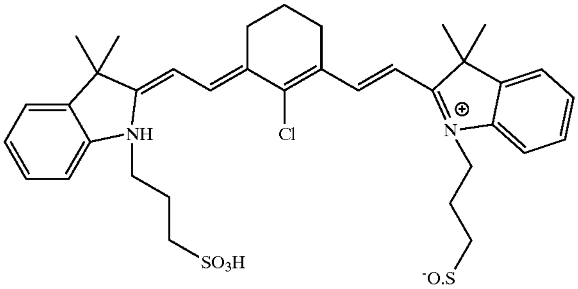 |
| IR DYE 7 | 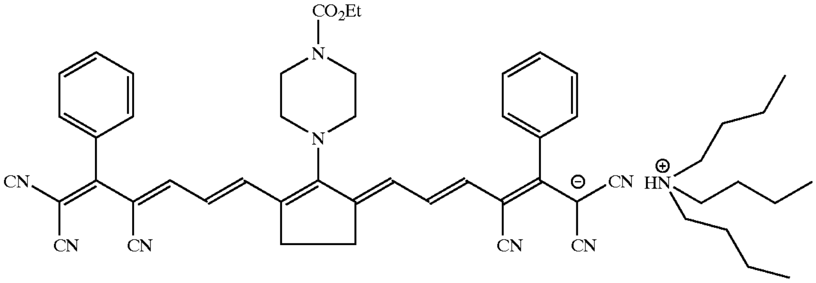 |
| IR DYE 8 | 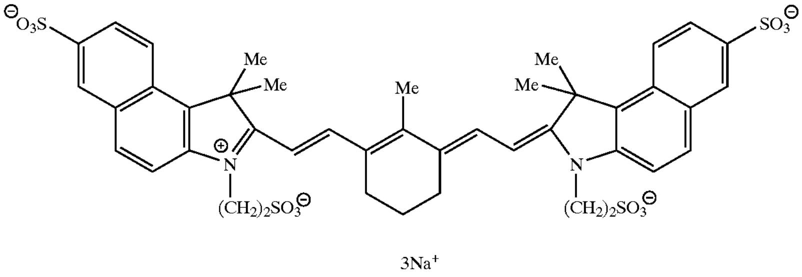 |
| IR DYE 9 | 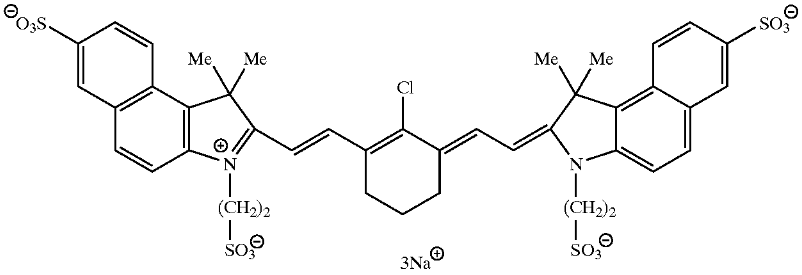 |
| IR DYE 10 | 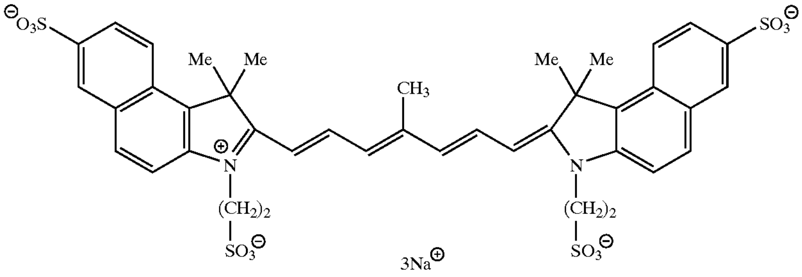 |

-continued
IR DYE TABLE
| IR DYE | STRUCTURE |
|---|---|
| IR DYE 11 | 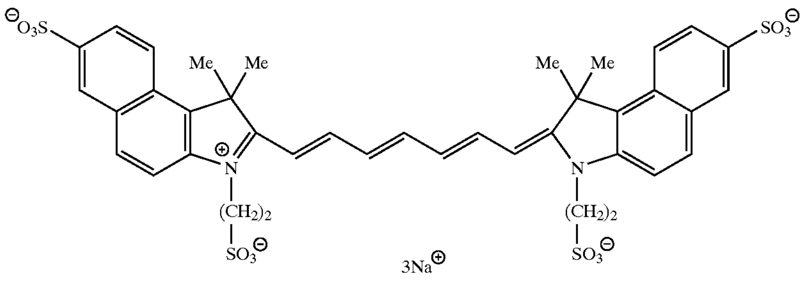 |
| IR DYE 12 | 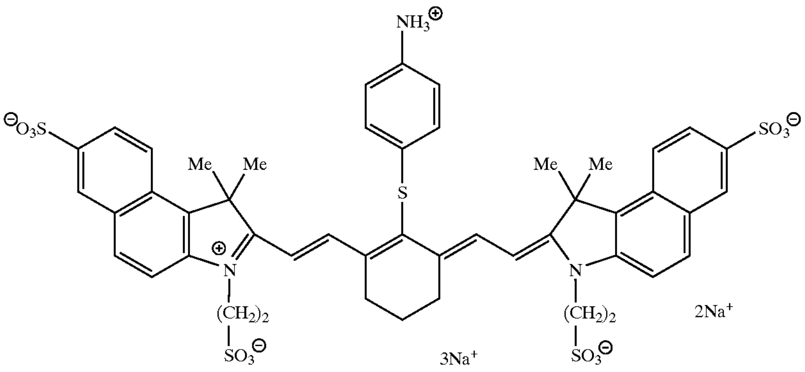 |
| IR DYE 13 | 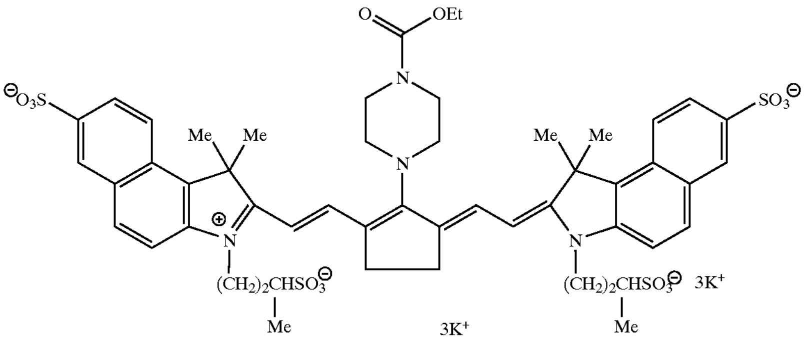 |
| IR DYE 14 | 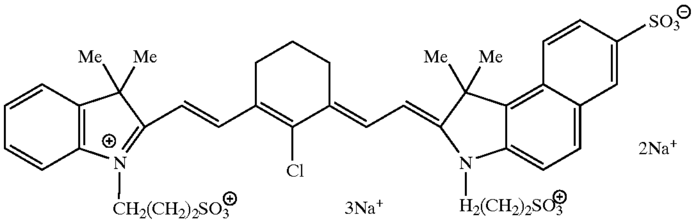 |
| IR DYE 15 | 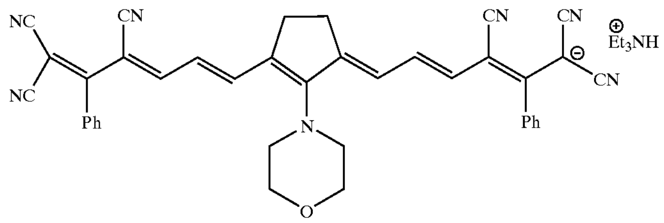 |

IR Dyes 1–7 may be prepared using known procedures or may be obtained from several commercial sources (for example, Esprit, Sarasota, Fla.). IR dyes 8–15 may also be prepared using known procedures, as reported, for example, in U.S. Pat. No. 4,871,656 (Parton et al.) and references reported therein (for example, U.S. Pat. Nos. 2,895,955, 3,148,187 and 3,423,207).

The photothermal conversion materials are generally present in the heat-sensitive composition and resulting heat-sensitive imaging layer in an amount sufficient to provide an optical transmission density of at least 0.1, and preferably at least 0.4, at the operating wavelength of the imaging laser (for example, 830 nm). The particular amount needed for this purpose would be readily apparent to one skilled in the art, depending upon the specific material used. For example, this amount could be from about 2 to about 30 weight %, preferably from about 10 to about 30 weight %.

The imaging layer of the imaging material can also include minor amounts (less than 20 weight %, based on total dry weight of the layer) of one or more binder or polymeric materials that will not adversely affect its imaging properties. Such materials can be water-soluble or water-dispersible. Examples of suitable polymeric binders include, but are not limited to hydrophilic synthetic and naturally-occurring polymers such as poly(vinylpyrrolidone) and vinylpyrrolidone-containing copolymers, polyethyloxazoline and oxazoline-containing copolymers, imidazole-containing polymers, polyacrylamides and acrylamide-containing copolymers, poly(vinyl alcohol) and vinyl alcohol-containing copolymers, poly(vinyl methyl ether), poly(vinyl ethyl ether), poly(alkylene oxide), gelatin (and derivatives thereof), cellulose ethers and esters, poly (vinylacetamides), partially hydrolyzed poly(vinyl acetate/ vinyl alcohol), poly(acrylic acid), sulfonated or phosphated polyesters and polystyrenes, casein, albumin, chitin, chitosan, dextran, pectin, collagen derivatives, collodian, agar-agar, arrowroot, guar, carrageenan, tragacanth, xanthan, rhamsan, and other materials readily apparent to one skilled in the art. Mixtures of the above listed binder materials polymers can be used.

The imaging layer can also include one or more conventional surfactants for coatability or other properties, dyes or colorants to allow visualization of the written image, humectants, biocides, viscosity builders, pH adjusting compounds, drying agents, defoamers, or any other addenda commonly used in the lithographic art, or combinations thereof, as long as the concentrations are low enough so they are inert with respect to imaging or printing properties.

The heat-sensitive composition of this invention can be applied to a support as a coating formulation using any suitable equipment and procedure, such as spin coating, knife coating, gravure coating, dip coating or extrusion hopper coating. In one embodiment, the coating formulation can be applied with a wire wound bar onto the support surface. In addition, the composition can be sprayed onto a support, including a cylindrical support, using any suitable spraying means for example as described in U.S. Pat. No. 5,713,287 (noted above). The coated formulations can be dried in any suitable manner to remove solvents and any other volatile components.

The heat-sensitive compositions of this invention are generally formulated in and coated from water or water-miscible solvents including, but not limited to, water-miscible alcohols (for example, methanol, ethanol, isopropanol, 1-methoxy-2-propanol, and n-propanol), methyl ethyl ketone, tetrahydrofuran, acetonitrile, N,N-dimethylformamide, butyrolactone, and acetone. Water, methanol, ethanol, and 1-methoxy-2-propanol are preferred. Mixtures (such as a mixture of water and methanol) of these solvents can also be used if desired. By "water-miscible" is meant that the solvent is soluble in water at all proportions at room temperature. The components of the coating formulation can be mixed in any suitable order.

While the heat-sensitive compositions of this invention are preferably used to prepare lithographic printing plates (or precursors thereof), they can be used for various other situations where a heat-sensitive composition may be useful to provide images. Thus, the heat-sensitive compositions are not intentionally limited to what are known as "direct-write" printing plates.

In preferred embodiments, the imaging materials of this invention can be of any useful form including, but not limited to, printing plates, printing cylinders, printing sleeves and printing tapes (including flexible printing webs), all of any suitable size or dimensions.

During use of preferred embodiments, the imaging material of this invention is exposed to a suitable source of energy that generates or provides heat, such as a focused laser beam, in an imagewise fashion in the foreground areas where ink is desired in the printed image, typically from digital information supplied to the imaging device. A laser used to expose the imaging material of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al.), incorporated herein by reference with respect to such imaging devices. The imaging material is typically sensitized so as to maximize responsiveness at the emitting wavelength of the laser. An example of a suitable radiation source is the commercially available Creo Trendsetter 3230 (Creo Products, Inc., Burnaby, BC, Canada) that contains a laser diode that emits near infrared radiation at a wavelength of about 830 nm. Additional useful radiation sources include direct imaging presses that are capable of imaging a printing plate while attached to a printing press cylinder. An example of a suitable direct imaging press includes the Heidelberg SM74-DI press (available from Heidelberg, Dayton, Ohio).

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between an imaging device (such as laser beam) and the imaging material can be achieved by rotating the drum (and the imaging member mounted thereon) about its axis, and moving the imaging device parallel to the rotation axis, thereby scanning the imaging member circumferentially so the image "grows" in the axial direction. Alternatively, the beam can be moved parallel to the drum axis and, after each pass across the imaging member, increment angularly so that the image "grows" circumferentially. In both cases, after a complete scan by the laser beam, an image corresponding to the original document or picture can be applied to the surface of the imaging member.

In the flatbed configuration, a laser beam is drawn across either axis of the imaging material, and is indexed along the other axis after each pass. Obviously, the requisite relative motion can be produced by moving the imaging member rather than the laser beam.

While laser imaging is preferred in the practice of this invention, imaging can be provided by any other means that provides or generates thermal energy in an imagewise fashion. For example, imaging can be accomplished using a thermoresistive head (thermal printing head) in what is known as "thermal printing", described for example in U.S. Pat. No. 5,488,025 (Martin et al.). Such thermal printing heads are commercially available (for example, as Fujitsu Thermal Head FTP-040 MCS001 and TDK Thermal Head F415 HH7-1089).

Advantageously, the resulting imaged printing plate can be mounted in a printing press without first being subjected to a separate processing step using alkaline developers. Instead, the imaged printing plate can be developed "on press" by the fountain solution and/or ink used in conventional printing presses. Alternatively, in embodiments that utilize direct imaging presses, the printing plate can be mounted on the direct image press, and then be exposed to infrared radiation and developed on press.

Suitable fountain solutions for developing the imaged printing plate include substantially aqueous solvents, but may also include water miscible organic liquids such as suitable alcohols, as well as alkaline materials. The unexposed areas of the heat sensitive layer are removed after being contacted with fountain solution and/or ink as part of the normal printing process, while exposed areas remain adhered to the support to form an ink receptive image area. Ink applied to the image area may then be imagewise transferred to a suitable receiving material (such as cloth, paper, metal, glass or plastic) to provide one or more desired impressions. If desired, an intermediate blanket roller may be used to transfer the ink from the printing plate to the receiving material. The printing plate may be cleaned between impressions, if desired, using conventional cleaning methods.

The following examples illustrate the practice of the invention, and are not intended to limit it in any way.

PREPARATIVE EXAMPLES 1–3

Preparation of Aqueous Dispersions 1–3 of Core Nitrocellulose Particles

Three aqueous dispersions of nitrocellulose particles were prepared using the following procedure and the components described in TABLE I below:

Nitrocellulose (70% in isopropanol, falling ball viscosity in 20:25:55 ethanol-toluene-ethyl acetate=18–25 cps) was dissolved in 200 g of ethyl acetate. Simultaneously, the noted amount of surfactant was dissolved in 500 g of water. The two solutions were combined and emulsified, first using a Silverson L4 mixer on the highest setting then by passage twice through an M-110T Microfluidizer (sold by Microfluidics). The volatile liquids were then stripped via rotary evaporation for 15–30 minutes after the condensates were observed as coming over as a single phase (water). As cellulose nitrate is highly combustible in the dry state, the % solids were determined indirectly (via a subtractive method by Karl Fischer titration for water) to be 9.0%. Particle size analysis by photon correlation spectroscopy using an Ultrafine Particle Analyzer instrument (Microtrac UPA150) showed a median particle diameter of 0.0536 μm.

TABLE I

| Components | Dispersion 1 | Dispersion 2 | Dispersion 3 |
|---|---|---|---|
| Cellulose nitrate A[1] (g) | 71.43 g | — | 71.5 |
| Cellulose nitrate B[2] (g) | — | 71.4 | — |
| Ethyl acetate (g) | 200.0 g | 200.0 | 200.0 |
| Alkanol XC solution[3] (g) | 75.0 | — | — |
| Dodecanethiol-endcapped acrylamide decamer[4] (g) | — | — | 75.0 |
| Uniquat CB-50 solution[5] (g) | — | 15.0 | — |
| Water (g) | 500.0 | 500.0 | 500.0 |
| Particle diameter (μm)[6] | 0.053 | 0.324 | 0.084 |
| % solids | 9.3 | 9.3 | 9.0 |

[1]Aldrich catalog #43,502-3: 11.8–12.2 wt. % nitrogen, viscosity = 18–25 cps (falling ball, 12.2 wt. % in ethanol-toluene-ethyl acetate, 25° C.), 70% in isopropanol.
[2]Aldrich catalog #43,509-0: 10.9–11.2 wt. % nitrogen, viscosity = 5–6.5 sec (falling ball, 12.2 wt. % in ethanol-toluene-ethyl acetate, 25° C.), 70% in isopropanol.
[3]Anionic surfactant - 10% in water (E. I. DuPont de Nemours & Co.).
[4]This nonionic surfactant was prepared as described in U.S. Pat. No. 6,127,453 (Column 9, lines 40–55, 10% solution in water).
[5]Cationic surfactant - 50% in water (available from Lonza Inc.).
[6]The particle size for Dispersion 1 was determined via photon correlation spectroscopy using an Ultrafine Particle Analyzer instrument (manufactured by Microtrac Inc.). The particle sizes for Dispersions 2 and 3 were determined via the Mie scattering method (Dispersion 1) using a Horiba LA-920 instrument (manufactured by Horiba LTD).

PREPARATIVE EXAMPLE 4

Preparation of Core/Shell Particles Consisting of a Nitrocellulose Core and a Poly(t-butyl acrylate-co-sulfopropyl acrylate) Shell The nitrocellulose dispersion (100 ml) of Preparative Example 1 was dialyzed for 16 hours using a 15K cutoff membrane to remove excess surfactant. The dialyzed dispersion was combined with 0.05 g of azobiscyanovaleric acid in a 500 ml 3-neck round bottom flask equipped with a magnetic stir bar, condenser, nitrogen inlet, and a rubber septum. Through the rubber septum was inserted a length of semi-rigid plastic tubing leading to a solvent pump fed through a second round bottom flask. The flask contained a rapidly stirring monomer suspension consisting of 12.74 g of t-butyl acrylate, 0.26 g of potassium 3-sulfopropyl acrylate, 0.13 g of sodium dodecylsulfate, 26.0 g of water, and 0.05 g of azobiscyanovaleric acid (pH adjusted to 7.0 with KOH). The contents of both flasks were bubble degassed with nitrogen for 10 minutes and the reactor flask was immersed in an oil bath at 70° C. The monomer suspension was added via the solvent pump over 90 minutes. The reaction was allowed to proceed for an additional 60 minutes at 70° C., then for 16 hours at 60° C. (10.2% solids). The median particle diameter was determined to be 0.0589 μm. The curve shape of the particle size distribution was identical to that obtained in Preparative Example 1 and slightly shifted to larger particle sizes. Examination of the particles by scanning electron microscopy showed a single distribution of particles.

PREPARATIVE EXAMPLE 5

Preparation of Core/Shell Particles Having Nitrocellulose Core and a Poly(phenyl acrylate-co-sulfopropyl acrylate) Shell This particle dispersion was prepared using the identical method and components as that described in Preparative Example 2, except that 12.74 g of phenyl acrylate was used instead of the t-butyl acrylate (12.4% solids). The median particle diameter was found to be 0.0664 μm with the same retention of curve shape observed in Preparative Example 2. Examination of the particles by scanning electron microscopy showed a single distribution of particles.

EXAMPLE 1

The core-shell particles of Preparative Examples 4 and 5 were used to prepare direct-write printing plates in the following manner. Coating solutions were formulated by combining each of the aqueous core/shell particle dispersions of Preparative Examples 4 and 5 with the components listed in TABLE II below and stirring until all of the reagents had dissolved. The coating solutions were each coated onto several strips of a brush and electrochemically grained, sulfuric acid anodized, silicate post-treated 12 mil (305 μm) lithographic aluminum substrate to provide a dry coverage of 100 $mg/ft^2$ (1.08 $g/m^2$) using conventional coating equipment. The coatings were allowed to dry at room temperature for at 24 hours.

TABLE II

| Coating Solution | Core/shell Dispersion # | Dispersion (g) | IR Dye[1] (g) | Lodyne S-228[2] | PVP/VA Binder[3] | Water |
|---|---|---|---|---|---|---|
| B | 3 | 5.80 | 0.087 | 0.017 | 1.200 | 22.90 |
| C | 4 | 5.80 | 0.087 | 0.017 | 1.200 | 22.90 |

[1]See IR Dye structure below
[2]Fluorosurfactant manufactured by Ciba Chemical, Tarrytown, NY.
[3]PVP/VA S-630 is a S-630 is poly(vinylpyrrolidone-co-vinylacetate) available from ISP IR Dye structure:

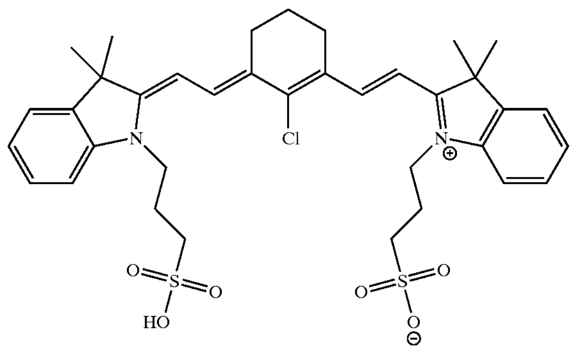

The imaging members were then thermally imaged using a commercially available Creo Trendsetter 3244 imaging device. Each resulting printing plate was patterned with three vertical stripes representing a range of net exposures (307, 451, and 615 $mJ/cm^2$). The plates were then mounted on an A. B. Dick duplicator press as pairs of corresponding overcoated and non-overcoated plates and run to 1000 impressions. In each case, the plates reached comparable printing densities by 25–50 impressions and printed with acceptable quality to 1000 impressions.

SEM evaluation: The imaged plates were examined in both the exposed and unexposed areas by scanning electron microscopy at magnifications up to 50,000×. In all cases, the imaged areas of the plates appeared as contiguous, uninterrupted surfaces while the imaged areas appeared as coatings of individual particles.

The invention has been described in detail with particular reference to certain preferred embodiments thereof, but it will be understood that variations and modifications can be effected within the spirit and scope of the invention.

We claim:

1. A heat-sensitive composition comprising a water-soluble or water-dispersible binder and dispersed therein, a photothermal conversion material, and hybrid particles of a combustible nitro-resin and an addition polymer derived from one or more ethylenically unsaturated polymerizable monomers.

2. An imaging material comprising a support having thereon an imaging layer comprising a water-soluble or water-dispersible binder and dispersed therein:

a photothermal conversion material, and hybrid particles of a combustible nitro-resin and an addition polymer derived from one or more ethylenically unsaturated polymerizable monomers.

3. The material of claim 2 wherein said addition polymer is represented by the following Structure I:

$$CH_2{=}C(R){-}X \qquad (I)$$

wherein R is hydrogen or methyl, and X is any monovalent moiety except a phenyl group.

4. The material of claim 3 wherein X is an alkyl ester, alkyl amide, aryl ester, or aryl amide group.

5. The material of claim 3 wherein R is hydrogen.

6. The material of claim 2 wherein said hybrid particles comprise a core of said nitro-resin and a shell of said addition polymer at least partially covering said core, the weight ratio of said core to said shell being from about 20:1 to about 0.2:1.

7. The material of claim 2 further comprising a protective overcoat disposed on said imaging layer.

8. The material of claim 2 wherein said hybrid particles comprise at least 25 weight % of said imaging layer, based on total dry layer weight.

9. The material of claim 8 wherein said hybrid particles comprise from about 70 to about 99 weight % of said imaging layer, based on total dry layer weight.

10. The material of claim 2 wherein the weight ratio of said nitro-resin to said addition polymer in said hybrid particles is from about 0.2:1 to about 20:1.

11. The material of claim 2 wherein said photothermal conversion material is a carbon black or an infrared radiation absorbing dye.

12. The material of claim 2 wherein said water-soluble or water-dispersible binder is poly(vinyl alcohol), poly(vinyl pyrrolidone), or a poly(vinyl pyrrolidone-co-vinyl acetate).

13. The material of claim 2 wherein said support is a polymeric film or metal sheet.

14. The material of claim 2 wherein said support is an on-press printing cylinder.

15. The material of claim 2 containing no thermoplastic particles.

16. A lithographic imaging material comprising a polyester or aluminum support having thereon a lithographic imaging layer comprising a water-soluble or water-dispersible binder and dispersed therein, core-shell particles comprising a core of nitrocellulose and a shell completely covering said core, said shell comprising an addition polymer that is poly(acrylate), poly(methacrylate), poly(acrylamide), or poly(methacrylamide), wherein said hybrid particles comprise from about 70 to about 99 weight % of said imaging layer, based on total dry layer weight.

17. A method of imaging comprising:

A) providing the imaging material of claim 2, and

B) imagewise exposing said imaging material to thermal energy to provide exposed and unexposed areas in said imaging layer of said imaging member, whereby said exposed areas are rendered more hydrophobic than said unexposed areas.

18. The method of claim 17 wherein said imagewise exposing is carried out using a thermoresistive head.

19. The method of claim 17 wherein said imaging material further comprises a photothermal conversion material, and said imagewise exposing is carried out using an infrared radiation emitting laser.

20. The method of claim 17 wherein said support of said imaging material is an on-press cylinder and said imaging member is provided in A) by spraying a formulation comprising a water-soluble or water-dispersible binder and dispersed therein, hybrid particles comprising nitrocellulose and an addition polymer derived from one or more ethylenically unsaturated polymerizable monomers, onto said on-press cylinder.

21. A method of printing comprising:

A) providing the imaging material of claim 2 that is a lithographic imaging material, B) imagewise exposing said lithographic imaging material to thermal energy to provide exposed and unexposed areas in said imaging layer of said lithographic imaging material, whereby said exposed areas are rendered more hydrophobic than said unexposed areas to provide a lithographic printing plate, and C) in the presence of water or a fountain solution, contacting said imagewise exposed lithographic printing plate with a lithographic printing ink, and imagewise transferring said lithographic printing ink to a receiving material.

22. The method of claim 1 carried out without alkaline development of said lithographic printing plate.

* * * * *